United States Patent [19]

Doyle et al.

[11] Patent Number: 5,407,850
[45] Date of Patent: Apr. 18, 1995

[54] SOI TRANSISTOR THRESHOLD OPTIMIZATION BY USE OF GATE OXIDE HAVING POSITIVE CHARGE

[75] Inventors: Brian S. Doyle, Framingham, Mass.; Ara Philipossian, Redwood Shores, Calif.

[73] Assignee: Digital Equipment Corporation, Maynard, Mass.

[21] Appl. No.: 85,321

[22] Filed: Jun. 29, 1993

[51] Int. Cl.⁶ .................... H01L 21/265; H01L 21/335
[52] U.S. Cl. ......................................... 437/45; 437/21; 437/941; 257/405
[58] Field of Search ........................... 437/21, 45, 941; 257/405

[56] References Cited

U.S. PATENT DOCUMENTS

| | | |
|---|---|---|
| 3,328,210 | 6/1967 | McCaldin et al. |
| 3,624,466 | 11/1971 | Schnable |
| 3,787,251 | 1/1974 | Brand et al. |
| 3,849,204 | 11/1974 | Fowler |
| 3,852,120 | 12/1974 | Johnson |
| 3,933,530 | 1/1976 | Mueller et al. ........................ 148/1.5 |
| 4,047,974 | 9/1977 | Harari |
| 4,566,173 | 1/1986 | Gössler et al. ......................... 29/571 |
| 4,772,927 | 9/1988 | Saito et al. ......................... 357/23.7 |
| 5,108,940 | 4/1992 | Williams ............................... 437/44 |
| 5,264,721 | 11/1993 | Gotou ................................ 257/349 |

FOREIGN PATENT DOCUMENTS 308814A 3/1989 European Pat. Off.
63-119527 5/1988 Japan.

OTHER PUBLICATIONS

Wolf, S. "Silicon Processing For The VLSI ERA" Lattice Press, Sunset Beach Calif., vol. 2 1990(pp. 66–72).
Wolf et al., vol. I & II, Silicon Processing for the VLSI Era, Lattice Press 1986, pp. 434–435 of vol. II.

*Primary Examiner*—George Fourson
*Assistant Examiner*—David Mason
*Attorney, Agent, or Firm*—James F. Thompson; Ronald C. Hudgens; Albert P. Cefalo

[57] ABSTRACT

Threshold optimization for SOI transistors is achieved through the formation of a layer of positive charge within the gate to correspond to the positive polarity formed in the substrate by ion implantation for threshold voltage control. A positive charge layer is formed by furnishing sulfur ions on the substrate before growth of an oxide to form a portion of the gate oxide. The sulfur will form a charge layer on the surface of the oxide, and an additional oxide is then deposited on the same to form the gate oxide as a sandwich with the positive charge layer in the same.

1 Claim, 1 Drawing Sheet

SOI TRANSISTOR THRESHOLD OPTIMIZATION BY USE OF GATE OXIDE HAVING POSITIVE CHARGE

BACKGROUND OF THE INVENTION

The present invention relates to integrated circuitry and, more particularly, to affecting the threshold voltage of integrated circuit devices.

Silicon-on-insulator (SOI) technology has been developed for forming transistors and other electrical devices in integrated circuitry. An SOI differs from more common bulk semiconductors in that the active region (the region in which the semiconductor electrical devices are formed) is a semiconductor layer separated from a semiconductor base by a dielectric region. If the semiconductor is silicon as is common, the dielectric typically is silicon dioxide. The active region of the SOI then becomes the layer of silicon which exists between the dielectric (or, in other words, the insulator) and the surface.

Use of SOI technology has the advantage of simplifying isolation of various electrical devices. Moreover, SOI transistors have low parasitic capacitance, low leakage currents, soft error immunity, etc. However, to obtain the full advantage of SOI, it is desirable that if the device is a transistor, it be fully depleting, i.e., that surface depletion extend through the active region to the dielectric region. Full depletion has many advantages, including providing higher mobility for the passage of charge, and it provides integrated circuitry having continuous current/voltage characteristics.

One problem with reducing the thickness of the active region in line with integrating semiconductor devices, is that the doping concentration necessary for threshold control of transistors formed on the active region may prevent full depletion. In this connection, the factor that governs the extent to which the surface depletion level extends into the active region is the concentration of dopants in such region. The high concentration which has been believed to be necessary to provide a desired threshold voltage prevents full depletion when the transistor gate oxide is thin. For example, if the oxide has a thickness of 50 Å units and it is desired that the threshold voltage be maintained at 0.5 V, the doping concentration for such threshold voltage is about $3 \times 10^{17}/cm^3$. With this thickness, a fully depleted device requires for the transistor to be fully depleting an active region thickness of the order of 500 Å. Such a thickness might not be compatible with the optimization of devices as the function of the devices would have a thickness of 500 Å and their resistance will be high. If thick active regions are used, many of the advantages of silicon-on-insulator (SOI) transistors are lost.

SUMMARY OF THE INVENTION

The present invention reduces the threshold voltage implantation which must be provided in an active region to control the operation of a device requiring a positive threshold voltage. It does this by incorporating a positive charge within the gate oxide of the device. Thus, from the broad standpoint, the method of the invention includes the step of intentionally providing a positive charge within a gate oxide of an integrated circuit device. It is particularly applicable to silicon-on-insulator (SOI) devices. As mentioned previously, to obtain the full advantage of SOI it is necessary that the active region be fully depleting. The incorporation within the gate oxide of a positive charge when the threshold voltage implant polarity is positive, alleviates the necessity of incorporating a large concentration of positive charge within the active region. The invention includes steps that have been discovered to enable a positive charge to be incorporated easily within the gate oxide. The invention also includes the product resulting from the method.

Other features and advantages of the invention either will become apparent or will be described in connection with the following, more detailed description of preferred embodiments of the invention.

BRIEF DESCRIPTION OF THE DRAWING

With reference to the accompanying drawing.

DETAILED DESCRIPTION OF THE INVENTION

The following relatively detailed description is provided to satisfy the patent statutes. However, it will be appreciated by those skilled in the art that various changes and modifications can be made without departing from the invention.

Figure 1:
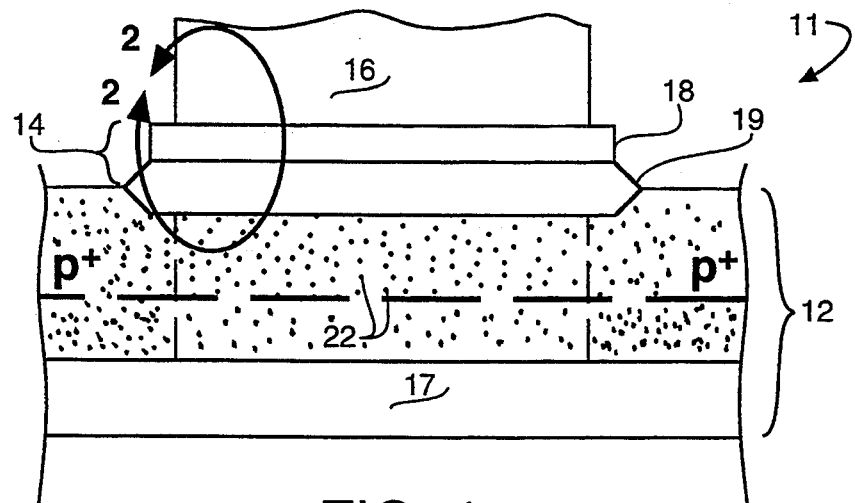
FIG. 1 is an idealized, schematic sectional view of partly fabricated integrated circuitry illustrating a preferred embodiment of the invention.

A portion of a silicon-on-insulator (SOI) transistor is generally referred to in FIG. 1 by the reference numeral 11. Within this portion a positive charge layer of the invention is formed within the gate oxide. With reference to such figure, a silicon-on-insulator substrate 12 is partly illustrated having both a gate oxide 14 and a polysilicon gate 16 of a transistor thereon. While the SOI substrate can be formed by any convenient mode utilized in the industry, in submicron technology such a substrate often is formed by ion implantation of an oxygen species, followed by thermal annealing to produce a buried oxide layer represented at 17. In this particular embodiment the silicon wafer is of p-type silicon as is illustrated.

As mentioned previously, although silicon-on-insulator transistors have been developed in the past, it is desirable that the SOI material in the transistor active region be fully depleted so that one can obtain the full advantages of SOI technology. Means also typically are provided to permit a positive threshold voltage to be established. The common approach is to use ion implantation to provide ions of the appropriate charge at the surface of a substrate. The difficulty with this approach with silicon-on-insulator technology is that as the thickness of the gate oxide is significantly reduced, the implantation dosage required to permit a typical positive threshold voltage to be attained, is quite high. If such a high dosage implantation is used, the SOI devices will be prevented from becoming fully depleted.

The present invention tackles the above problem by incorporating a positive charge in the gate oxide of a transistor to reduce (or in the extreme case entirely eliminate) the ion implantation dosage required for the establishment of a threshold voltage. To this end, the gate oxide is provided as two layers 18 and 19 between which a positively charged layer 21 (see FIG. 2) is provided. This construction results in a positive charge being not only inside the gate oxide but also close to the substrate-gate oxide interface. That is, it is spaced sufficiently far from the gate 16 to act to provide the capacitance necessary for threshold voltage.

Figure 2:
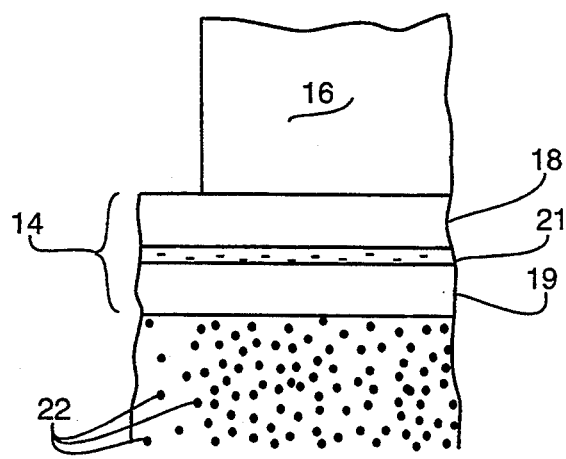
FIG. 2 is a significantly enlarged view, showing the encircled portion of FIG. 1.

It is to be noted that it is not intended that the positive charge layer provide all of the charge necessary for establishing a threshold voltage. Rather, standard ion implantation in the substrate is combined with the effect of the positive charge layer to provide threshold voltage. This ion implantation for threshold voltage purposes is indicated in FIGS. 1 and 2 by dots 22.

The required dosage concentration for the ion implantation to achieve threshold control is significantly reduced in view of the provision of the positive charge layer. For example, when the charge layer is provided with a concentration of positive charge equal to about $1.5 \times 10^{12}$ atoms/cm$^2$ and the doping concentration in the silicon need only be about $5 \times 10^{16}$ atoms/cm$^3$ for a threshold voltage of 0.5 volts. This enables the thickness of the silicon to be reduced to 0.1 μm and yet be fully depleting when the gate oxide is about 65 Å thick.

Positive charge layer 21 can be formed in various ways. It can be formed by sulfur ions. They can be introduced into the gate oxide by treating the substrate with an aqueous H$_2$SO$_4$/H$_2$O$_2$ solution following the traditional pre-oxidation cleaning procedures. An oxide layer 19 is thermally grown in a conventional manner. The sulfur and, hence, the positive charge will be concentrated at its surface. The oxide layer 19 then can be formed via conventional deposition.

The positive charge is quite stable and does not degrade over time. In addition, subsequent high temperature oxidations and/or anneals as the integrated circuitry is being formed do not reduce the extent of the positive charge. The inclusion of the positive charge reduces the ion implantation concentration necessary to enable the desired threshold voltage to be established.

As mentioned at the beginning of the detailed description, applicants are not limited to the specific embodiment described above. Various changes and modifications can be made. The claims, their equivalents and their equivalent language define the scope of protection.

What is claimed is:

1. A method, comprising the steps of:

forming a silicon-on-insulator (SOI) substrate having an active region thickness of 1000 angstroms;

depositing a sulfur-bearing solution on the surface of said SOI substrate;

exposing said SOI substrate with said sulfur-bearing solution thereon to an elevated temperature to grow a lower portion of a gate insulator layer having sulfur ions in the upper portion thereof at an areal density of $1.5 \times 10^{12}$ ions per square centimeter;

forming an upper portion of said gate insulator layer on top of said lower portion of said gate insulator layer, said upper and lower portions of said gate insulator layer being formed such that said gate insulator layer has an overall thickness of 65 angstroms and said sulfur ions are disposed in the middle thereof; and doping the region of said substrate beneath said gate insulator layer with a p-type dopant to a volumetric dopant density of $5 \times 10^{16}$ dopant atoms per cubic centimeter.

* * * * *